(12) United States Patent
Delshadpour et al.

(10) Patent No.: US 10,862,720 B2
(45) Date of Patent: Dec. 8, 2020

(54) PHASE LOCKED LOOP FREQUENCY SHIFT KEYING DEMODULATOR USING AN AUXILIARY CHARGE PUMP AND A DIFFERENTIAL SLICER

(71) Applicant: NXP B.V., Eindhoven (NL)

(72) Inventors: Siamak Delshadpour, Phoenix, AZ (US); Xueyang Geng, Chandler, AZ (US); Ahmad Yazdi, Chandler, AZ (US)

(73) Assignee: NXP B.V., Eindhoven (NL)

( * ) Notice: Subject to any disclaimer, the term of this patent is extended or adjusted under 35 U.S.C. 154(b) by 27 days.

(21) Appl. No.: 16/154,196

(22) Filed: Oct. 8, 2018

(65) Prior Publication Data

US 2020/0112465 A1    Apr. 9, 2020

(51) Int. Cl.
| | | |
|---|---|---|
| *H04L 27/152* | (2006.01) | |
| *H03K 5/24* | (2006.01) | |
| *H03L 7/087* | (2006.01) | |
| *H03L 7/089* | (2006.01) | |
| *H03L 7/099* | (2006.01) | |
| *H03L 7/107* | (2006.01) | |
| *H04B 1/10* | (2006.01) | |
| *H03K 5/08* | (2006.01) | |

(52) U.S. Cl.
CPC .......... *H04L 27/152* (2013.01); *H03K 5/249* (2013.01); *H03K 5/2481* (2013.01); *H03L 7/087* (2013.01); *H03L 7/0891* (2013.01); *H03L 7/0896* (2013.01); *H03L 7/0995* (2013.01); *H03L 7/107* (2013.01); *H04B 1/1027* (2013.01); *H03K 5/082* (2013.01)

(58) Field of Classification Search
CPC ......... H04L 7/0891; H04L 27/16; H04L 5/12; H04L 7/00; H04L 27/22; H04L 27/152; H03L 7/0812; H03L 27/152; H03L 7/087; H03L 7/0896; H03L 7/0995; H03L 7/107; H03L 7/0891; H03K 5/2481; H03K 5/249; H04B 1/1027
USPC ............ 331/16, 34; 375/371, 320, 322, 334; 329/312, 315, 317, 300, 302
See application file for complete search history.

(56) References Cited

U.S. PATENT DOCUMENTS

| 5,347,228 A | 9/1994 | Iwaski |
| 5,949,281 A | 9/1999 | Sharpe |

(Continued)

FOREIGN PATENT DOCUMENTS

| DE | 3022287 A1 | 12/1981 |
| DE | 256971 A1 | 5/1988 |

OTHER PUBLICATIONS

H. Gustat, et. al., "Integrated FSK Demodulator With Very High Sensitivity", IEEE Journal of Solid-State Circuits, vol. 38, No. 2, pp. 357-360. (Feb. 2003).

(Continued)

*Primary Examiner* — Arnold M Kinkead

(57) ABSTRACT

Various embodiments relate to a PLL based FSK demodulator, the FSK demodulator comprising a PFD configured to receive an input signal, a fully differential auxiliary charge pump configured to receive and amplify the input signal from the PFD, a capacitor configured to filter the input signal from the auxiliary charge pump and a fully differential slicer configured to demodulate the input signal and output recovered data.

15 Claims, 3 Drawing Sheets

(56) References Cited

U.S. PATENT DOCUMENTS

| | | | | |
|---|---|---|---|---|
| 6,847,251 B2* | 1/2005 | Kao | .................... | H03K 3/011 |
| | | | | 327/536 |
| 7,292,670 B2* | 11/2007 | Gupta | .................... | H03L 7/0812 |
| | | | | 375/326 |
| 2006/0071716 A1* | 4/2006 | Fang | .................... | H03L 7/0891 |
| | | | | 331/16 |
| 2016/0380758 A1* | 12/2016 | Sai | .................... | H04L 7/0332 |
| | | | | 375/376 |

OTHER PUBLICATIONS

"Universal Serial Bus Power Delivery Specification", Jan. 12, 2017, Revision 2.0, Version 1.3, USB Implementers Forum, retrieved from the internet at https://www.usb.org/document-library/usb-power-delivery on May 23, 2019.

Delshadpour, Siamak et al., "An FSK Transceiver for USB Power Delivery in 0.14-μm CMOS Technology", 31st IEEE International System-On-Chip Conference (SOCC), Sep. 4, 2018, pp. 23-28, IEEE, Piscataway, NJ, USA.

* cited by examiner

PHASE LOCKED LOOP FREQUENCY SHIFT KEYING DEMODULATOR USING AN AUXILIARY CHARGE PUMP AND A DIFFERENTIAL SLICER

TECHNICAL FIELD

This disclosure relates generally to a frequency shift keying ("FSK") demodulator, and more specifically, but not exclusively, to a FSK demodulator with an auxiliary charge pump and differential slicer.

BACKGROUND

FSK demodulators may be implemented in several different methods, for example, in injection locked techniques to achieve gigabits data range, in PLL based demodulators with high efficiency rectifier or in mixers and envelope detectors or in fully digital processing.

A phase-locked loop ("PLL") may act as a precise frequency modulation ("FM") demodulator if the PLL bandwidth is large enough to allow the voltage-controlled oscillator ("VCO") input to follow the modulating signal.

PLL demodulators are also widely used in signal processing and by choosing a low-gain VCO, a high demodulation sensitivity can be achieved providing a high signal-to-noise ratio ("SNR"). However, when using a standard PLL, a low VCO gain implies a small tuning range.

For integrated PLLs, however, a relatively large tuning range is required to compensate for variations in temperature and technology parameters. This prevents a high resolution of simple integrated PLL demodulators. Therefore, a highly sensitive integrated PLL demodulator must have a relatively wide tuning range while maintaining a low VCO gain. Using a main PLL path, which has a high sensitivity cannot provide the required bit error rate, however, by using the auxiliary path with a charge pump and fully differential comparator to recover the data, the required bit error rate can be achieved.

PLL based demodulators use a control voltage of VCO as demodulated data, which is a small signal that needs to be amplified, which makes the achieved SNR low. For high SNR applications, for example, USBPD FSK transceiver, using a PLL based demodulator that tracks the input signal and demodulates it with high SNR at output is required.

SUMMARY OF EXEMPLARY EMBODIMENTS

A brief summary of various embodiments is presented below. Embodiments address the need to create a PLL based FSK demodulators using an auxiliary charge pump and a differential slicer.

In order to overcome these and other shortcomings of the prior art and in light of the need to create PLL based FSK demodulator using an auxiliary charge pump and a differential slicer, a brief summary of various exemplary embodiments is presented. Some simplifications and omissions may be made in the following summary, which is intended to highlight and introduce some aspects of the various exemplary embodiments, but not to limit the scope of the invention.

Detailed descriptions of a preferred exemplary embodiment adequate to allow those of ordinary skill in the art to make and use the inventive concepts will follow in later sections.

Various embodiments relate to a PLL based FSK demodulator, the FSK demodulator including a PFD configured to receive an input signal, a fully differential auxiliary charge pump configured to receive and amplify the output signal from the PFD, a capacitor configured to filter the input signal from the auxiliary charge pump and a fully differential slicer configured to demodulate the input signal and output recovered data.

In an embodiment of the present disclosure, the PLL based FSK demodulator further including a PLL loop including a charge pump configured to receive the input signal, a second order loop filter configured to filter the input signal from the charge pump and a low gain ring voltage controlled oscillator ("VCO") configured to provide demodulated data from a control voltage.

In an embodiment of the present disclosure, the capacitor is a high bandwidth low pass filter.

In an embodiment of the present disclosure, the fully differential auxiliary charge pump has a wide bandwidth to provide fast settling of the input signal.

In an embodiment of the present disclosure, the slicer is a differential comparator with hysteresis.

In an embodiment of the present disclosure, the slicer is configured to change a differential output of the fully differential auxiliary charge pump to CMOS-level.

Various embodiments relate to a method for tracking an input signal and demodulating the input signal using a PLL based FSK demodulator, the method including the steps of receiving, by a PFD, the input signal, receiving and amplifying, by a fully differential auxiliary charge pump, the input signal from the PFD, filtering, by a capacitor, the input signal from the auxiliary charge pump, demodulating, by the slicer, the input signal and outputting, by the slicer, the recovered data.

In an embodiment of the present disclosure, the method for tracking an input signal and demodulating the input signal, the method further including the steps of receiving, by a single output charge pump, the input signal, filtering, by a second order loop filter, the input signal from the single output charge pump and providing, by a VCO, demodulated data from a control voltage.

In an embodiment of the present disclosure, the capacitor is a high bandwidth low pass filter.

In an embodiment of the present disclosure, the auxiliary charge pump has a wide bandwidth to provide fast settling of the input signal.

In an embodiment of the present disclosure, the slicer is a differential comparator with hysteresis.

In an embodiment of the present disclosure, the slicer is configured to change a differential output of the auxiliary charge pump to CMOS-level.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

These and other more detailed and specific features are more fully disclosed in the following specification, reference being had to the accompanying drawings, in which.

DETAILED DESCRIPTION OF THE INVENTION

Figure 1:
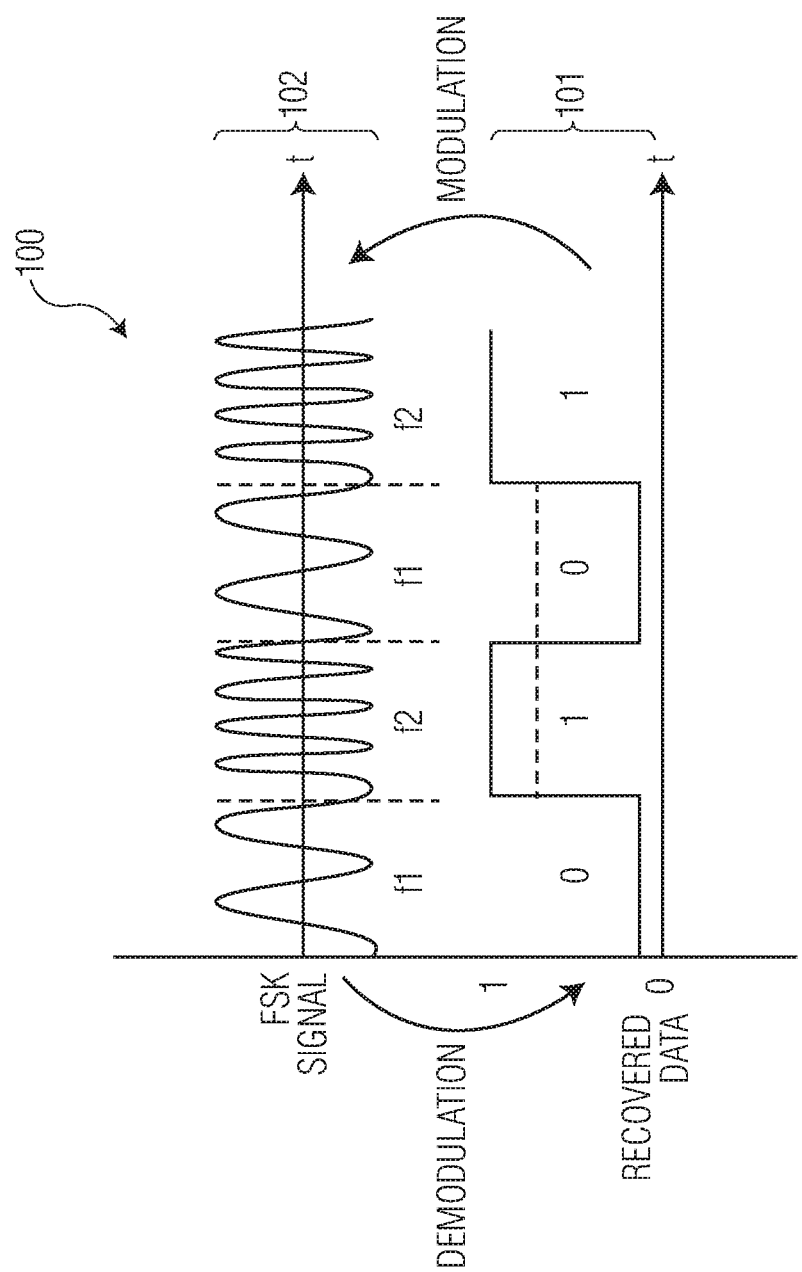
FIG. 1 illustrates a graph of a FSK signal being modulated and demodulated of the current embodiment.

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art, and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. Descriptors such as "first," "second," "third," etc., are not meant to limit the order of elements discussed, are used to distinguish one element from the next, and are generally interchangeable.

The current embodiment is directed towards a phase-locked loop ("PLL") based frequency-shift keying ("FSK") demodulator which includes a path with an auxiliary charge pump connected to the phase-frequency detector ("PFD") of PLL with a high bandwidth filter and a differential slicer.

Higher bandwidth allows for a fast settling time of the demodulated data, while the PLL loop can be slower (e.g., lower PLL loop filter bandwidth) for better phase noise performance. For example, the bandwidth of the main PLL loop is between 1 MHz-2 MHz and the bandwidth of the auxiliary PLL loop is between 4 MHz-5 MHz.

The current embodiment is directed towards a demodulator which can be used for high signal-to-noise ("SNR") applications, with a small bit-error rate ("BER").

PLL based FSK demodulators use the control voltage of the voltage controlled oscillator ("VCO") as the demodulated signal, however, using that node impacts PLL noise performance and further it is a weak signal that needs amplification. Using the control voltage from the VCO results in a lower SNR at the FSK demodulator output.

The current embodiment takes the PFD output and uses an extra charge pump with a higher bandwidth low pass filter after that, which makes the tracking speed faster.

The FSK demodulator of the current embodiment allows for low noise and fast response as the auxiliary path after the PFD avoids the PLL phase noise degradation.

FIG. 1 illustrates a graph 100 of a FSK signal being modulated and demodulated of the current embodiment.

The graph 100 shows two types of a data, 0/1 data 101 and an FSK signal 102.

The graph 100 shows 0/1 data 101 and the result of FSK modulation which is an FSK signal 102. In recovering the data, changing the modulated FSK signal 102 to 0/1 data 101 is FSK demodulation.

Figure 2:
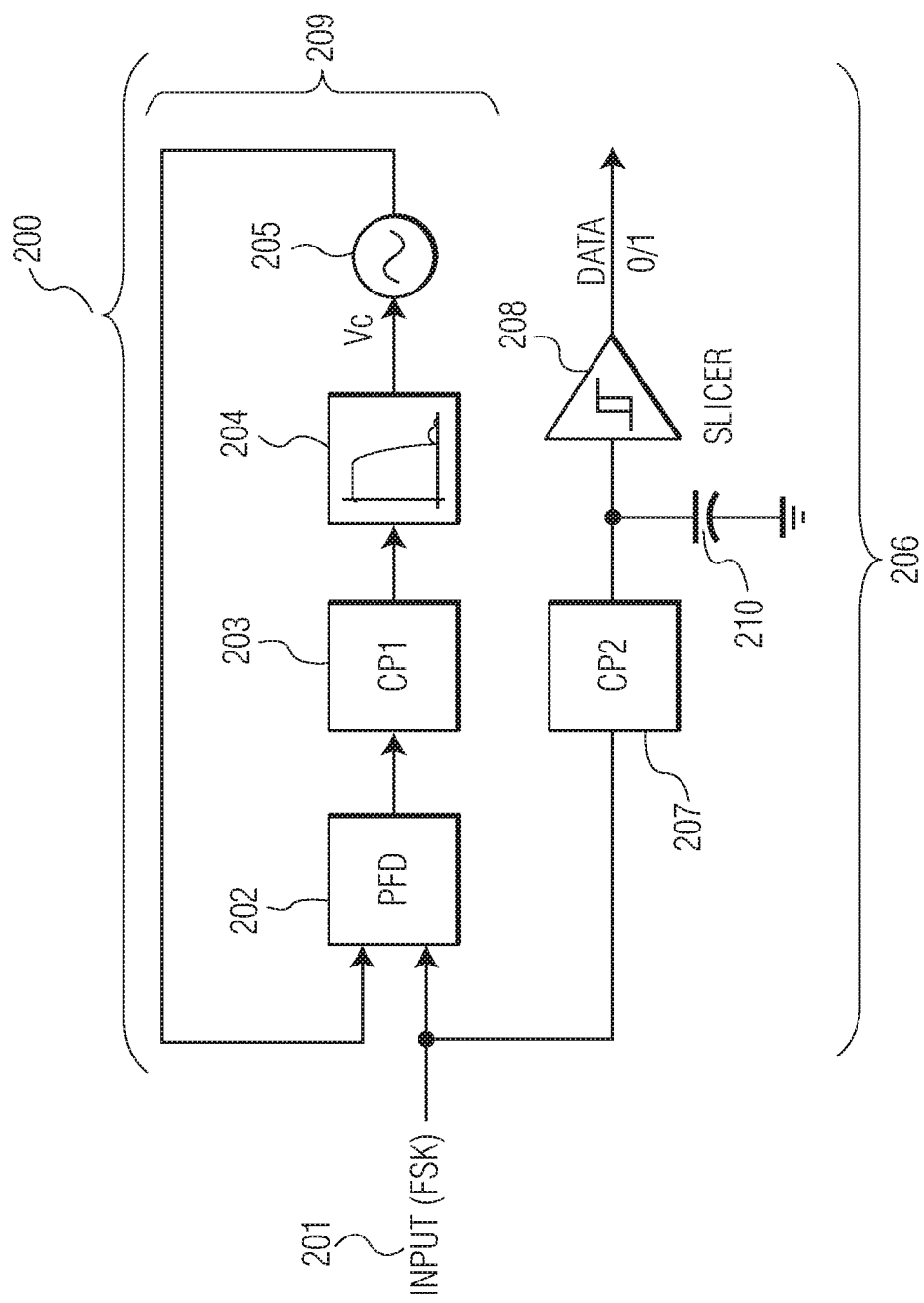
FIG. 2 illustrates a block diagram of a PLL based FSK demodulator with an auxiliary charge pump path of the current embodiment.

FIG. 2 illustrates a block diagram of a PLL based FSK demodulator 200 with an auxiliary charge pump path of the current embodiment.

The FSK demodulator 200 includes an input FSK signal 201, a PFD 202, a charge pump 203, a second order loop filter 204, and a VCO 205 which are part of the PLL loop 209. The additional path 206 includes a charge pump 207, a capacitor as a filter 210 and a differential slicer 208.

The PLL loop 209 is an integer N PLL with N=1. The additional path 206 includes the charge pump 207 and a differential slicer 208 which demodulates the incoming signal from the PFD 202, which has been filtered and hard limited.

The PLL loop 209 includes a PFD 202, a charge pump 203, a second order loop filter 204 and a low gain ring VCO 205. The low gain of the VCO reduces the noise impact of the control voltage and the current consumption of the PLL loop 209.

In the current embodiment, the PLL loop 209 bandwidth needs to be BW≈2($\Delta f+1/\tau_b$) where, $\Delta f$ is the deviation frequency and $\tau_b$ is the bitrate, which will be approximately 1.3 MHz for a universal serial bus ("USB") power delivery ("PD") FSK signal, where $\Delta f$=0.5 MHz and $\tau_b$=300 KHz/2. But other values may be used for other applications.

Based on the input signal 201, the PLL bandwidth is designed to be 1.3 MHz. The charge pump 207 may have a wider bandwidth to provide fast settling of the output signal. Settling time is proportional to 1/bandwidth, therefore a wider bandwidth provides a faster settling time. The differential slicer 208, which is a differential comparator with hysteresis, will change the signal to a CMOS level signal. The initial settling time is less than 50 µs, while it is less than 2 µs during transition after the initial wake up time. Again, other PLL bandwidth and settling times may be used for other applications.

PLL based demodulators use the control voltage of VCO as the demodulated data, however, it is a signal that needs to be amplified and taking that node and amplifying it provides less SNR because of the low voltage level of $V_c$.

$V_c$ is a sensitive node and touching it will impact the phase noise performance of VCO, which makes the PLL phase noise worse, which results in the achieved SNR of demodulated FSK being lower. The $V_c$ may be filtered, however, this will provide recovered data, but the difference between the minimum and maximum values (high/low or 1/0) is small and an amplification will be needed. Because of process variation and DC level changes, setting a threshold value between low and high signals to separate them increases the chance of losing data and big duty cycle distortion is expected to occur.

In FIG. 2, charge pump 203 has a single output while the charge pump 207 is fully differential. The differential output of charge pump 207 is filtered, by using a small capacitor 210 and is input into a differential slicer 208 with hysteresis, which makes the differential slicer 208 less sensitive to the DC level of the charge pump 208 output.

Any relative polarity change will be translated as transition from "0 to 1" or "1 to 0", and the duty cycle may be approximately 50%.

Figure 3:
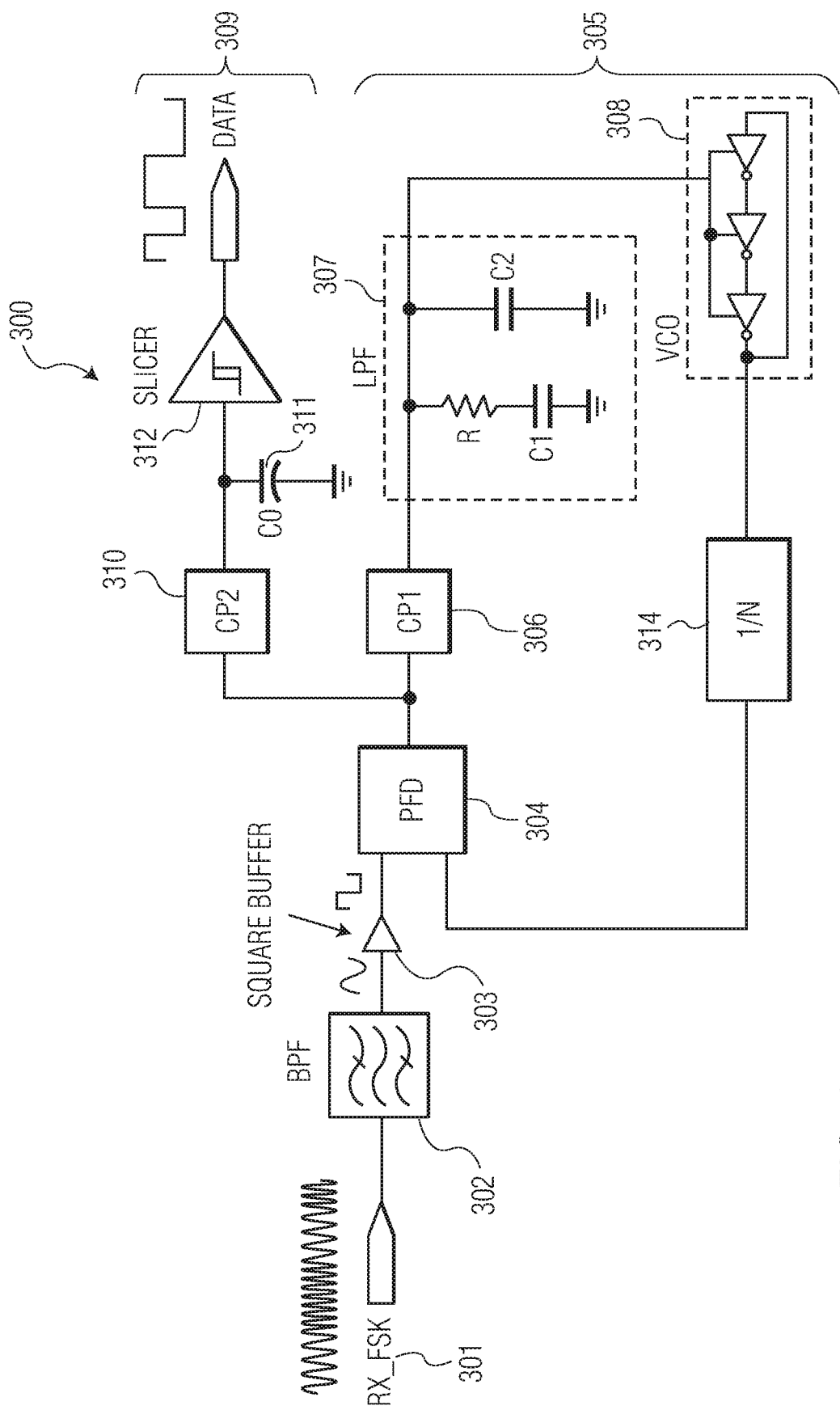
FIG. 3 illustrates a block diagram of a FSK receiver which uses the FSK demodulator in FIG. 2 of the current embodiment.

FIG. 3 illustrates a block diagram of a FSK receiver 300 which uses the FSK demodulator in FIG. 2 of the current embodiment.

The input signal 301 is input into a BPF 302 and then a square buffer and into a PFD 304. The PLL loop 305 includes a PFD 304, a charge pump 306, a low pass filter 307, a VCO 308, and a 1/N feedback scaler 314 (where N=1 for the current application).

The additional path includes a charge pump 310, a capacitor 311 and a differential slicer 312.

The FSK demodulator of the current embodiment may be used for low noise, meaning applications with a high SNR which is equal to a low BER and low duty cycle distortion of the demodulated signal, meaning the digital core which needs to process the recovered data, will not need a high accuracy clock for further processing of the signal.

It should be apparent from the foregoing description that various exemplary embodiments of the invention may be implemented in hardware. Furthermore, various exemplary embodiments may be implemented as instructions stored on a non-transitory machine-readable storage medium, such as a volatile or non-volatile memory, which may be read and executed by at least one processor to perform the operations described in detail herein. A non-transitory machine-readable storage medium may include any mechanism for storing information in a form readable by a machine, such as a personal or laptop computer, a server, or other computing device. Thus, a non-transitory machine-readable storage medium may include read-only memory (ROM), random-access memory (RAM), magnetic disk storage media, optical storage media, flash-memory devices, and similar storage media and excludes transitory signals.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in machine readable media and so executed by a computer or processor, whether or not such computer or processor is explicitly shown.

Accordingly, it is to be understood that the above description is intended to be illustrative and not restrictive. Many embodiments and applications other than the examples provided would be apparent upon reading the above description. The scope should be determined, not with reference to the above description or Abstract below, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A phase-locked loop ("PLL") based frequency-shift keying ("FSK") demodulator, the FSK demodulator comprising:
   a phase-frequency detector ("PFD") configured to receive an input signal;
   a fully differential auxiliary charge pump configured to receive and amplify the input signal from the PFD;
   a capacitor configured to filter the input signal from the auxiliary charge pump; and
   a fully differential slicer configured to demodulate the input signal and output recovered data; and
   further comprising a PLL loop comprising:
      a charge pump configured to receive the input signal;
      a second order loop filter configured to filter the input signal from the charge pump; and
      a low gain ring voltage controlled oscillator ("VCO") configured to provide demodulated data from a control voltage.

2. The PLL based FSK demodulator of claim 1, wherein the capacitor is a high bandwidth low pass filter.

3. The PLL based FSK demodulator of claim 1, wherein the fully differential auxiliary charge pump has a wide bandwidth to provide fast settling of the input signal.

4. The PLL based FSK demodulator of claim 1, wherein the slicer is a differential comparator with hysteresis.

5. The PLL based FSK demodulator of claim 1, wherein the slicer is configured to change a differential output of the fully differential auxiliary charge pump to CMOS-level.

6. A phase-locked loop ("PLL") based frequency-shift keying ("FSK") demodulator, the FSK demodulator comprising:
   a phase-frequency detector ("PFD") configured to receive an input signal;
   a fully differential auxiliary charge pump configured to receive and amplify the input signal from the PFD;
   a capacitor configured to filter the input signal from the auxiliary charge pump; and
   a fully differential slicer configured to demodulate the input signal and output recovered data;
   wherein the capacitor is a high bandwidth low pass filter.

7. The PLL based FSK demodulator of claim 6, further comprising:
   a PLL loop comprising,
      a charge pump configured to receive the input signal;
      a second order loop filter configured to filter the input signal from the charge pump; and
      a low gain ring voltage controlled oscillator ("VCO") configured to provide demodulated data from a control voltage.

8. The PLL based FSK demodulator of claim 6:
wherein the fully differential auxiliary charge pump has a wide bandwidth to provide fast settling of the input signal.

9. The PLL based FSK demodulator of claim 6:
wherein the slicer is a differential comparator with hysteresis.

10. The PLL based FSK demodulator of claim 6:
wherein the slicer is configured to change a differential output of the fully differential auxiliary charge pump to CMOS-level.

11. A phase-locked loop ("PLL") based frequency-shift keying ("FSK") demodulator, the FSK demodulator comprising:
- a phase-frequency detector ("PFD") configured to receive an input signal;
- a fully differential auxiliary charge pump configured to receive and amplify the input signal from the PFD;
- a capacitor configured to filter the input signal from the auxiliary charge pump; and
- a fully differential slicer configured to demodulate the input signal and output recovered data;

wherein the fully differential auxiliary charge pump has a wide bandwidth to provide fast settling of the input signal.

12. The PLL based FSK demodulator of claim 1, further comprising:
- a PLL loop comprising,
  - a charge pump configured to receive the input signal;
  - a second order loop filter configured to filter the input signal from the charge pump; and
  - a low gain ring voltage controlled oscillator ("VCO") configured to provide demodulated data from a control voltage.

13. The PLL based FSK demodulator of claim 11:
wherein the capacitor is a high bandwidth low pass filter.

14. The PLL based FSK demodulator of claim 11:
wherein the slicer is a differential comparator with hysteresis.

15. The PLL based FSK demodulator of claim 11:
wherein the slicer is configured to change a differential output of the fully differential auxiliary charge pump to CMOS-level.

* * * * *